(12) United States Patent
Emami

(10) Patent No.: US 8,929,063 B2
(45) Date of Patent: Jan. 6, 2015

(54) ELECTRONIC STORAGE MEDIUM

(75) Inventor: Arman Emami, Berlin (DE)

(73) Assignee: John Tu, Fountain Valley, CA (US)

( * ) Notice: Subject to any disclaimer, the term of this patent is extended or adjusted under 35 U.S.C. 154(b) by 0 days.

(21) Appl. No.: 13/876,640

(22) PCT Filed: Sep. 30, 2011

(86) PCT No.: PCT/DE2011/001827
§ 371 (c)(1),
(2), (4) Date: Mar. 28, 2013

(87) PCT Pub. No.: WO2012/041295
PCT Pub. Date: Apr. 5, 2012

(65) Prior Publication Data
US 2013/0182386 A1 Jul. 18, 2013

(30) Foreign Application Priority Data
Sep. 30, 2010 (DE) .......................... 10 2010 047 659
Sep. 30, 2010 (DE) ..................... 20 2010 014 089 U

(51) Int. Cl.
*G06F 1/16* (2006.01)
(52) U.S. Cl.
USPC .................................. 361/679.32; D14/480.3
(58) Field of Classification Search
CPC .................................. G06F 1/184; G06F 1/18

USPC ............ 361/679.32; D14/480.3; D3/208, 207
See application file for complete search history.

(56) References Cited

U.S. PATENT DOCUMENTS

| 576,339 | A | * | 2/1897 | Clayton | ....................... 24/600.7 |
|---|---|---|---|---|---|
| D258,921 | S | * | 4/1981 | Brentini | ......................... D3/207 |
| D640,263 | S | * | 6/2011 | Huang | ...................... D14/480.3 |
| D662,941 | S | * | 7/2012 | Emami | ....................... D14/480.3 |
| 8,542,483 | B2 | * | 9/2013 | Huang | .................... 361/679.32 |
| 2001/0030883 | A1 | | 10/2001 | Iima et al. | |
| 2013/0044423 | A1 | * | 2/2013 | Huang | .................... 361/679.32 |
| 2013/0107442 | A1 | * | 5/2013 | Zhou | ....................... 361/679.32 |

FOREIGN PATENT DOCUMENTS

GB 576339 A 3/1946
WO 2010/017645 A1 2/2010

* cited by examiner

*Primary Examiner* — Forrest M Phillips
(74) *Attorney, Agent, or Firm* — Patent Central LLC; Stephan A. Pendorf

(57) ABSTRACT

A flat electronic storage medium, in particular a USB memory stick which has a fastening facility. The fastening means (1) is integrated into the housing (2) of the storage medium in that the housing (2) has a slit through-opening (3) or a lateral hook-shaped housing extension (11) of a flat side of the housing, the hook end (12) of which extension forms a slit (4) with the housing (2), and each slit of the slit through-opening (3) or slit (4) can be closed off by a pin (5) arranged in a guide (6) such that said pin can slide in the housing (2).

14 Claims, 4 Drawing Sheets

ELECTRONIC STORAGE MEDIUM

Figure 1:
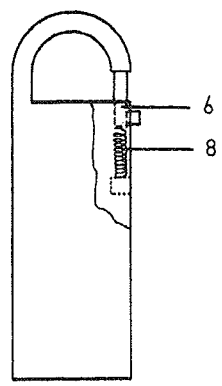
Figure 1:
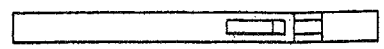
Figure 1:
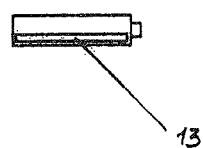
Figure 1:
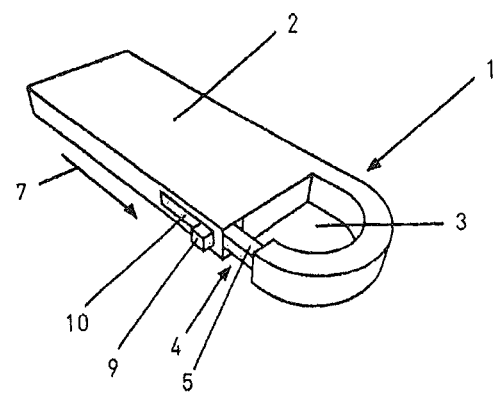

The invention relates to a flat electronic storage medium, in particular a USB memory stick, which comprises an attachment option.

Due to technological advances, constantly smaller and more affordable electronic storage media, in particular USB sticks, are being produced. Moreover, they are used increasingly as a mobile storage medium which is carried while being on the move, and as such they are a constant companion. However, the volume reduction of such data carriers at the same time entails the risk of their being difficult to find or lost when transported. To counteract this, such data carriers are often provided with an opening during production, said opening penetrating the housing, so that they can be attached to other objects such as key fobs, bags, etc., by means of a wire or a chain. This is very inconvenient in practice, however, because when using the data carriers or handing them over to someone else, they have to be removed from such other objects first.

To counteract this, clamping arrangements on USB sticks have been proposed in PCT/DE010/000590, so as to be able to attach these USB sticks to a planar surface in a manner similar to a paper clip. While this construction is convenient for transport by mail, it is not so for the use of the USB stick as a constant companion while being on the move, because the "clamped-on" data carrier can detach during transport and thus is not attached securely to other objects. The data carrier can detach and be lost.

Furthermore, USB sticks are on offer on the market which comprise an annular loop in the form of a snap hook. By tilting a section of the loop ring (snapper) into the loop, the loop is opened such that the USB stick can be attached to another thin object such as a key fob or a bag.

The above-mentioned snap-hook-shaped loops have some other disadvantages, however. Due to the snapper being tilted towards the interior, the opening inevitably cannot be smaller than a certain minimum dimension. The miniaturization effect achieved for the storage electronics is thus lost. Moreover such spring-hook-shaped loops are rather uncomfortable in their overall handling.

Furthermore, a flat-shaped electronic storage medium is known from US 2001/003 0883 A1, the housing of which has a slit opening which can be opened and closed by a manually operable pin.

The disadvantage of this solution is that closing has to occur manually, which quickly leads to errors and thus to the storage medium being lost. In addition, the pin is to be able to be moved over the width of the storage medium, which makes it more difficult to achieve miniaturization.

The object of the invention is to propose an attachment option for a flat electronic storage medium, in particular a USB stick, which attachment can be opened and closed easily and which does not negate the advantages achieved by the miniaturization of the storage electronics and which provides a high degree of operational reliability. This object is achieved with the features of claim 1, advantageous realizations are the subject of the subclaims.

According to the invention, for a flat-shaped electronic storage medium having an attachment arrangement in the form of a loop which can be opened and closed, it is proposed that the attachment arrangement be integrated into the housing of the storage medium by the housing having a slit-shaped through-opening or a lateral hook-shaped extension, the hook end of which forms a slit with the housing, and each slit being able to be closed by a pin which is slidingly arranged in a guide in the housing, wherein the pin is retained in the closed position by a force acting upon it and can be opened by a counterforce to be applied by the hand.

By using a sliding pin for closing the slit of the opening, the entire width of the slit is available for attaching it to and detaching it from another object. This is highly user-friendly.

Furthermore, it is ensured that the opening is closed at all times. It is opened only upon a deliberate action by the user. Afterward, the slit closes again immediately.

In a preferred embodiment the pin comprises an actuating stud which protrudes from the housing. The actuating stud is preferably supported in a guided manner in a housing slit.

The slit can be arranged in the flat boundary region of the housing such that the vertical slit plane of the housing slit for the actuating stud includes a 90° angle with the axis of the opening, or the housing slit is arranged in the flat housing area such that the vertical slit plane of the housing slit for the actuating stud extends parallel to the axis of the opening.

In the case of a hook-shaped housing extension, the housing slit is preferably arranged in the flat housing area.

To guarantee a secure attachment of the storage medium to another object, it is advantageous if the pin in the closed state rests in the housing with both sides, preferably in a housing opening. In an advantageous embodiment the closing force for the pin is applied in the closing direction by a spring. Opening the slit by moving the pin into the housing is then achieved against the force of a spring.

As the spring, a spiral spring is provided which is arranged in the pin guide or a spring wire which is supported in a restrained manner in the housing and which acts on the pin with one end.

The pin itself can be formed in the shape of an arc or extending in a straight manner and have a rectangular, square or circular cross-section.

The slit opening in the housing is circular or has an elliptical shape or a rectangular shape or a triangular shape or a prismatic shape.

Figure 2:
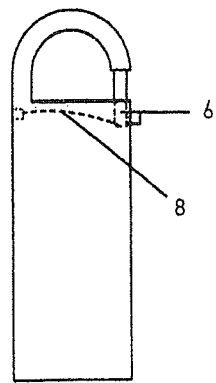
Figure 2:
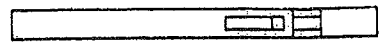
Figure 2:
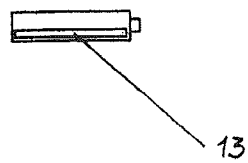
Figure 2:
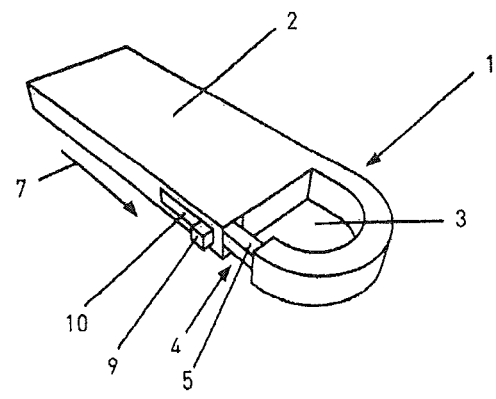
Figure 3:
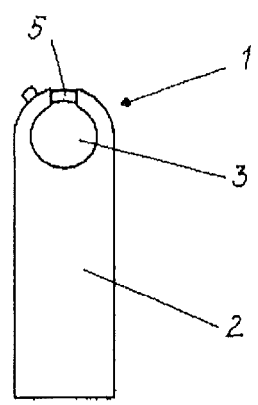
Figure 4:
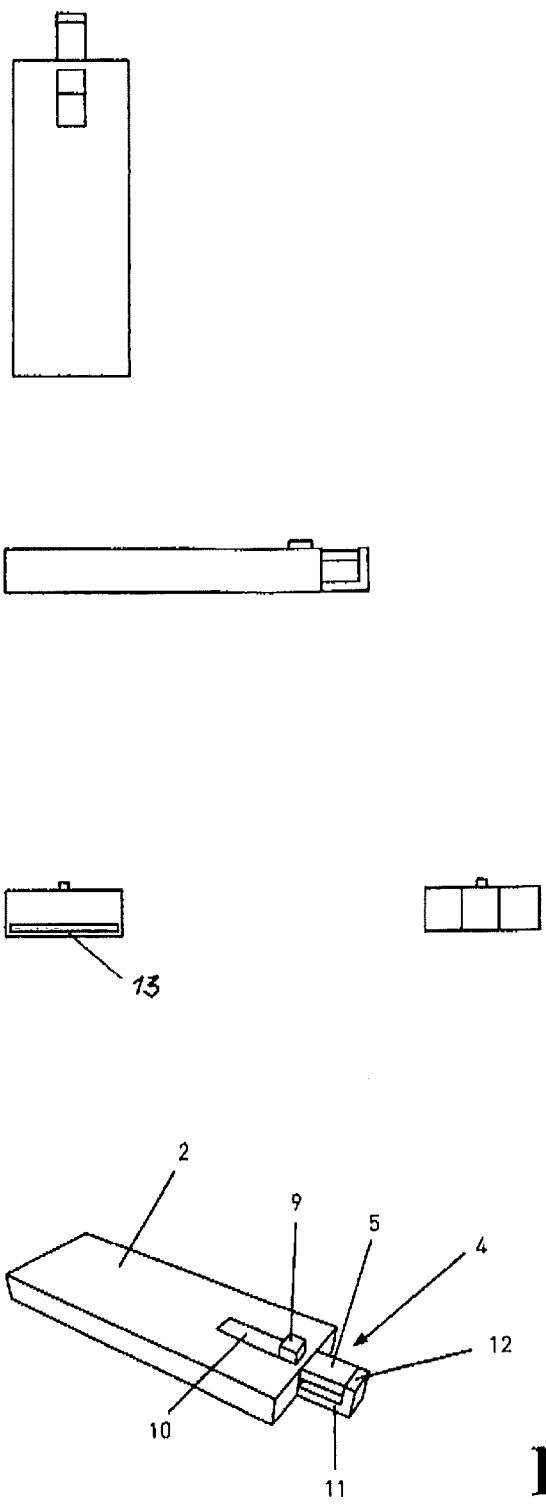

The proposed attachment option for an electronic storage medium will now be explained with reference to three exemplary USB sticks. In the drawings FIG. 1 shows a USB stick having a semicircular opening,
FIG. 2 shows a USB stick having a semicircular opening,
FIG. 3 shows a USB stick having a circular opening, and
FIG. 4 shows a USB stick having a hook-shaped housing extension.

FIG. 1 shows four views of a flat-shaped electronic storage medium (USB stick) having an attachment arrangement 1 which is integrated into the housing 2 of the storage medium by the housing 2 having a slit semicircular through-opening 3, wherein the slit 4 can be closed by a straight pin 5 which is slidingly arranged in a guide 6 in the housing 2.

In the closed state, the pin 5 rests with both sides in a housing opening in the housing 2, wherein in the closing direction 7 the pin 5 is loaded by a spring 8, a spiral spring in this case, which is arranged in the pin guide 6.

The pin 5 further comprises an actuating stud 9 which laterally protrudes from the housing 2. The actuating stud 9 is supported in a guided manner in a housing slit 10. The vertical slit plane of the housing slit 10 for the actuating stud 9 includes a 90° angle with the axis of the opening 3.

In this manner the USB stick can be held in one hand, and with the thumb the pin 5 can be slid into the position: "opened slit 4" by sliding the actuating stud 9. The slit opening of the USB stick can then be placed, for example, over the edge of the slider opening of a zipper, a necklace, a key ring or an opening in another object. Under the spring action of the spring 8, the pin 5 snaps back to the position: "closed slit 4", as shown, by releasing the actuating stud 9, and the USB stick is attached to the object.

The USB stick comprises electric connections 13.

FIG. 2 also shows four views of a flat-shaped electronic storage medium (USB stick) having an attachment arrangement 1 which is integrated into the housing 2 of the storage medium by the housing 2 having a slit semicircular through-opening 3, wherein the slit 4 can be closed by a straight pin 5 which is slidingly arranged in a guide 6 in the housing 2.

In the closed state, the pin 5 rests with both sides in a housing opening in the housing 2, wherein in the closing direction 7 the pin 5 is loaded by a spring 8, a bent spring wire in this case.

The pin 5 further comprises an actuating stud 9 which laterally protrudes from the housing 2. The actuating stud 9 is supported in a guided manner in a housing slit 10. The vertical slit plane of the housing slit 10 for the actuating stud 9 includes a 90° angle with the axis of the opening 3.

In FIG. 3 the flat-shaped electronic storage medium (USB stick) is provided with an attachment arrangement 1 which has a circular opening 3. The slit 4 can be closed in this case by an arc-shaped pin 5. Also in this case the pin 5 is preferably loaded by a spring 8.

FIG. 4 shows five views of a flat-shaped electronic storage medium (USB stick) having an attachment arrangement 1 which is integrated into the housing 2 of the storage medium by the housing 2 having a lateral hook-shaped housing extension 11 of the flat housing side, the hook end 12 of which forms a slit 4 with the housing 2, wherein the slit 4 can be closed by the straight pin 5 which is slidingly arranged in a guide 6 in the housing 2.

In the closed state, the pin 5 rests with both sides in a housing opening in the housing 2, in this case a housing opening and an opening in the hook end 12, wherein in the closing direction 7 the pin 5 is loaded by a spring 8.

The pin 5 further comprises an actuating stud 9 which protrudes from the housing 2 from the flat housing area. The actuating stud 9 is supported in a guided manner in a housing slit 10. This type of attachment is suitable for attachment to thin objects, e.g. a necklace. Here, the USB stick always lies flat against the body.

The invention claimed is:

1. A flat-shaped electronic storage medium having an attachment arrangement in the form of a loop which can be opened and closed, wherein the attachment arrangement (1) is integrated into the housing (2) of the storage medium by the housing (2) having a slit through-opening (3) or a lateral hook-shaped housing extension (11) of a flat housing side, the hook end (12) of which forms a slit (4) with the housing (2), and each slit of the through-opening (3) or slit (4) formed by the hook end (12) and housing (2) being able to be closed by the pin (5) which is slidingly arranged in a guide (6) in the housing (2), wherein the pin is retained in the position "closed slit" by a force acting permanently upon it, and wherein the pin (5) has first and second ends and in the closed state rests with both ends in the housing (2).

2. The electronic storage medium according to claim 1, wherein the pin (5) has first and second ends and in the closed state rests with both ends in a housing opening of the housing (2).

3. The electronic storage medium according to claim 1, wherein the pin (5) is loaded by a spring (8) in the closing direction (7).

4. The electronic storage medium according to claim 1, wherein the pin (5) comprises an actuating stud (9) which protrudes from the housing (2).

5. The electronic storage medium according to claim 4, wherein the actuating stud (9) is supported in a guided manner in a housing slit (10).

6. The electronic storage medium according to claim 4, wherein the vertical slit plane of the housing slit for the actuating stud (9) includes a 90° angle with the axis of the opening (3) or extends parallel thereto.

7. The electronic storage medium according to claim 4, wherein in the case of a hook-shaped housing extension (11), the housing slit (10) is preferably arranged in the flat housing area.

8. The electronic storage medium according to claim 1, wherein the pin (5) is formed extending in a straight manner.

9. The electronic storage medium according to claim 1, wherein the pin (5) has a rectangular, square or circular cross-section.

10. The electronic storage medium according to claim 1, wherein the spring (8) is a spiral spring which is arranged in the pin guide (6).

11. The electronic storage medium according to claim 1, wherein the spring (8) is a spring wire which is supported in a restrained manner in the housing and which acts on the pin (5) with one end.

12. The electronic storage medium according to claim 1, wherein the opening (3) has a circular shape or an elliptical shape or a rectangular shape or a triangular shape or a prismatic shape.

13. The electronic storage medium according to claim 1, wherein the pin (5) is formed in the shape of an arc.

14. A flat-shaped electronic storage medium having an attachment arrangement in the form of a loop which can be opened and closed, wherein the attachment arrangement (1) is integrated into the housing (2) of the storage medium by the housing (2) having a slit through-opening (3) or a lateral hook-shaped housing extension (11) of a flat housing side, the hook end (12) of which forms a slit (4) with the housing (2), and each slit of the through-opening (3) or slit (4) formed by the hook end (12) and housing (2) being able to be closed by the pin (5) which is slidingly arranged in a guide (6) in the housing (2), wherein the pin is retained in the position "closed slit" by a force acting permanently upon it, wherein the pin (5) has first and second ends and in the closed state rests with both ends in the housing (2) and forms part of the loop.

\* \* \* \* \*